US009322845B2

(12) United States Patent
Akahori et al.

(10) Patent No.: US 9,322,845 B2
(45) Date of Patent: Apr. 26, 2016

(54) CURRENT APPLYING DEVICE

(71) Applicant: HONDA MOTOR CO., LTD., Tokyo (JP)

(72) Inventors: Shigeto Akahori, Tochigi (JP); Nobuo Kambara, Tochigi (JP)

(73) Assignee: HONDA MOTOR CO., LTD., Tokyo (JP)

( * ) Notice: Subject to any disclaimer, the term of this patent is extended or adjusted under 35 U.S.C. 154(b) by 60 days.

(21) Appl. No.: 14/269,624

(22) Filed: May 5, 2014

(65) Prior Publication Data

US 2014/0333337 A1   Nov. 13, 2014

(30) Foreign Application Priority Data

May 8, 2013   (JP) ................................. 2013-098604

(51) Int. Cl.
*G01R 1/067* (2006.01)
*G01R 31/00* (2006.01)
*G01R 1/36* (2006.01)

(52) U.S. Cl.
CPC .............. *G01R 1/06716* (2013.01); *G01R 1/36* (2013.01)

(58) Field of Classification Search
CPC ................. H01L 2924/00013; H01L 23/3675; G01R 1/06716; G01R 31/2889
USPC ........... 324/755.04, 500, 537, 755.01; 257/48
See application file for complete search history.

(56) References Cited

U.S. PATENT DOCUMENTS

| 5,811,878 | A  | * | 9/1998  | Harmoinen  | H01L 25/072 257/723 |
| 6,046,524 | A  | * | 4/2000  | Yamanouchi | H03F 13/00 310/313 R |
| 6,049,109 | A  | * | 4/2000  | Omura      | H01L 29/868 257/104 |
| 7,649,369 | B2 |   | 1/2010  | Okumura et al. | |
| 7,776,626 | B2 | * | 8/2010  | Hasebe     | G01R 31/2889 257/48 |
| 9,182,443 | B2 | * | 11/2015 | Shaue      | G01R 31/2601 |
| 2002/0053917 | A1 | * | 5/2002 | Tanioka    | G01R 1/07357 324/755.01 |
| 2004/0021149 | A1 | * | 2/2004 | Kitazawa   | H01L 23/051 257/108 |

(Continued)

FOREIGN PATENT DOCUMENTS

JP   63-141368     6/1988
JP   2005-249693   9/2005

(Continued)

OTHER PUBLICATIONS

Japanese Office Action dated Jan. 20, 2015, Application No. 2013-098604, 2 pages.
Japanese Office Action dated Sep. 8, 2015, 2 pages.

*Primary Examiner* — Huy Q Phan
*Assistant Examiner* — Giovanni Astacio-Oquendo
(74) *Attorney, Agent, or Firm* — Rankin, Hill & Clark LLP

(57) ABSTRACT

A current applying device in which a contact electrode is destroyed firstly when a large current is applied in the event of failure. A probe device is configured by serially connecting a contact body that is to be in contact with the surface of a power semiconductor to apply a current and a pressing body assembly that presses the contact body so as to apply the current to the power semiconductor and is configured so that, when the pressing body power applied to the pressing body assembly is smaller than the withstand power of the pressing body assembly, the contact body power applied to the contact body is larger than the withstand power of the contact.

2 Claims, 5 Drawing Sheets

(56) References Cited

U.S. PATENT DOCUMENTS

2004/0070413 A1* 4/2004 Kasukabe .......... G01R 1/06744
324/754.07
2008/0036479 A1 2/2008 Okumura et al.

FOREIGN PATENT DOCUMENTS

| JP | 2008-541056 | 11/2008 |
| JP | 2011-137791 | 7/2011 |
| WO | 2006/119405 | 11/2006 |

* cited by examiner

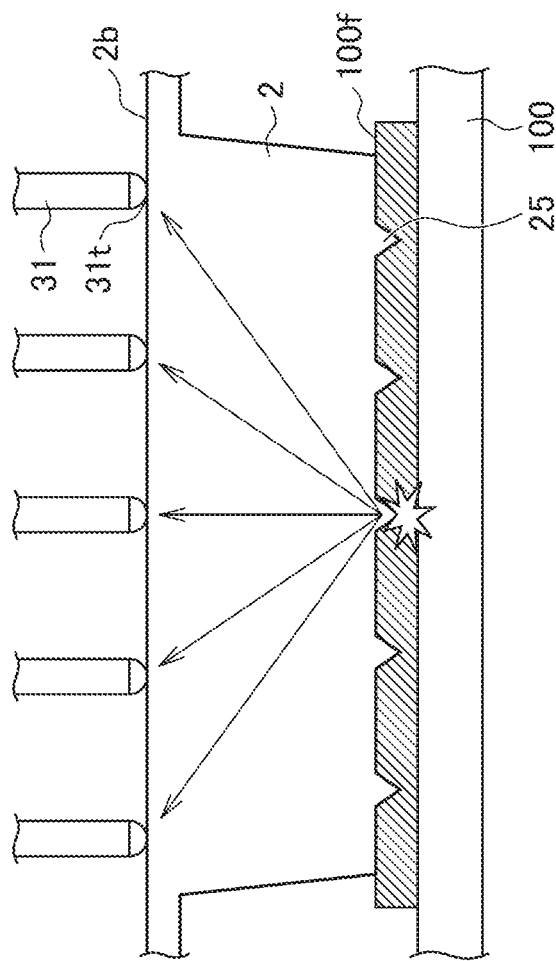
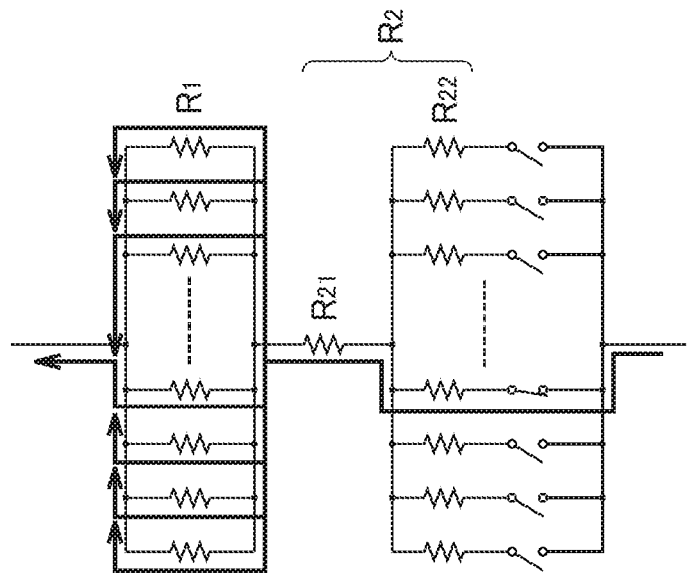
FIG. 4A
FIG. 4B

CURRENT APPLYING DEVICE

This application is based on and claims the benefit of priority from Japanese Patent Application No. 2013-098604, filed on 8 May 2013, the content of which is incorporated herein by reference.

BACKGROUND OF THE INVENTION

1. Field of the Invention

The present invention relates to a current applying device that applies a current to a semiconductor. In particular, the present invention relates to a current applying device used for inspecting a power semiconductor to which a large current needs to be applied.

2. Related Art

In the related art, a technique is known about a large-current probe pin for allowing an extremity of the probe pin to be in contact with a semiconductor so as to be electrified (for example, refer to Patent Document 1). In the technique disclosed in Patent Document 1, the probe pin is configured to include a contact member where a plurality of contact portions for electrifying are formed which are arranged in a distributive way, a plunger which is made of a rod-shaped conductive member and has an extremity to which the contact body is attached and a posterior extremity to which a wire end portion is connected, and a coil spring which exerts a force on the plunger so as to allow the contact body to be in contact with the semiconductor. In addition, a peripheral edge of the contact member is radially branched to constitute the contact portions, a center region of the contact member is fixed to the plunger by a fastener which is inserted into a fastener insertion hole in a depression of the extremity surface of the plunger, and the contact portion extends to the outer peripheral side from the inner peripheral edge of the depression.

According to the technique disclosed in Patent Document 1, the contact portion of the contact member is oscillated like a seesaw with respect to the inner peripheral edge of the depression as a supporting point when the contact portion is in contact with the semiconductor. Then, it is considered that, at the time of oscillation, variation in contact pressure is alleviated by deformation of a portion close to the center region of the contact portion of the contact member, and thus, although there are some unevenness or irregularities at the probe-pin contact portion of the surface of the semiconductor, the contact state between the plurality of contact portions of the contact member and the surface of the semiconductor is aligned and stabilized.

[Patent Document 1] Japanese Unexamined Patent Application, Publication No. 2011-137791

SUMMARY OF THE INVENTION

However, it is considered that a contact electrode of a probe device which is in contact with the surface of a semiconductor is configured as a disposable member. In the event of failure when a large current is applied to the probe device, it is preferable that the contact electrode be destroyed earlier than the probe device and the destroyed contact electrode blocks the current to protect the probe device from the large current.

The present invention is for solving the above-described problems and an object thereof is to provide a current applying device where a contact electrode is destroyed firstly when a large current is applied in the event of failure.

(1) A current applying device (for example, the later-described probe device 1) which is configured by serially connecting a contact electrode (for example, the later-described contact body 2) which is to be in contact with the surface of a semiconductor (for example, the later-described power semiconductor 100) to apply a current and a pressing body (for example, the later-described pressing body assembly 3) which presses the contact electrode and applies the current to the semiconductor, wherein the current applying device is configured so that when the pressing body power (for example, the later-described pressing body power $I^2 \cdot R_1$) applied to the pressing body is smaller than the withstand power (for example, the later-described withstand power $W_1$) of the pressing body, the contact electrode power (for example, the later-described contact body power $I^2 \cdot R_2$) applied to the contact electrode is larger than the withstand power (for example, the later-described withstand power $W_2$) of the contact electrode.

According to the present invention (1), the contact electrode and the pressing body are serially connected to each other so that when the larger current in the event of failure is applied to the current applying device which applies a current to the semiconductor, the pressing body power is smaller than the withstand power of the pressing body and the contact electrode power applied to the surface of the contact electrode which is in contact with the semiconductor is larger than the withstand power of the surface.

Herein, the contact electrode is inexpensive and easy to manufacture and is suitable for disposable products. On the other hand, the pressing body is expensive and hard to manufacture and ensures durability, and thus, the pressing body needs to be repaired in a case when the pressing body is destroyed by Joule's heat when a large current in the event of failure is applied to the pressing body.

According to the present invention, when the large current in the event of failure is applied to the current applying device, the contact electrode is destroyed earlier than the pressing body. Accordingly, the destroyed contact electrode blocks the large current in the event of failure to protect the pressing body from the large current. Therefore, it is possible to use the pressing body for its own lifespan without being repaired.

(2) The current applying device according to (1), wherein the pressing body power is calculated based on the resistance (for example, the later-described $R_{11}$) of the pressing body itself and the contact resistance (for example, the later-described $R_{12}$) between the pressing body and the contact electrode, wherein the contact electrode power is calculated based on the resistance (for example, the later-described $R_{21}$) of the contact electrode itself and the contact resistance (for example, the later-described $R_{22}$) between the contact electrode and the semiconductor, and wherein the current applying device is configured so that when the pressing body power applied to the pressing body is smaller than the withstand power of the pressing body, the contact electrode power applied to the contact electrode is larger than the withstand power of the contact electrode.

According to the present invention (2), the pressing body power is calculated based on the resistance of the pressing body itself and the contact resistance between the pressing body and the contact electrode, and the contact electrode power is calculated based on the resistance of the contact electrode itself and the contact resistance between the contact electrode and the semiconductor. Therefore, it is possible to calculate the pressing body power, which is smaller than the withstand power of the pressing body, and the contact electrode power, which is larger than the withstand power of the surface of the contact electrode. Accordingly, when the large current in the event of failure is applied to the current applying device, it is possible to configure the relationship where the pressing body power is smaller than the withstand power of the pressing body and the contact electrode power applied to the surface of the contact electrode at the side which is in contact with the semiconductor is larger than the withstand power of the surface.

(3) The current applying device according to (1) or (2), wherein the pressing body includes a plurality of elastic bodies (for example, the later-described pressing pins 31), and wherein the relationship where the pressing body power (for example, the later-described pressing body power $I^2 \cdot R_1$) applied to the pressing body is smaller than the withstand power (for example, the later-described withstand power $W_1$) of the pressing body is equal to the relationship where the elastic body power (for example, the later-described pressing-pin power $(I/N_1)^2 \cdot (R_{11}+R_{12})$) applied to one elastic body of all the elastic bodies is smaller than the withstand power (for example, the later-described withstand power $W_{11}$) of one elastic body.

According to the present invention (3), the relationship between the pressing body power and withstand power of the pressing body is substituted by the relationship between the elastic body power and withstand power of one elastic body of all the elastic bodies, so that the relationship can be easily designed according to the unit component, that is, one elastic body.

According to the present invention, it is possible to provide a current applying device where a contact electrode is destroyed firstly when a large current in the event of failure is applied.

BRIEF DESCRIPTION OF THE DRAWINGS

FIG. 1A is an exploded view, and FIG. 1B is an overall view.

FIG. 3A is a diagram illustrating the components, and FIG. 3B is a circuit diagram.

FIGS. 4A and 4B are diagrams illustrating the case (Case 1) when a large current in the event of failure is applied to the probe device according to the embodiment, FIG. 4A is a state diagram, and FIG. 4B is a circuit diagram.

FIG. 5A is a state diagram, and FIG. 5B is a circuit diagram.

DETAILED DESCRIPTION OF THE INVENTION

Hereinafter, embodiments of the present invention will be described.

Figure 1:
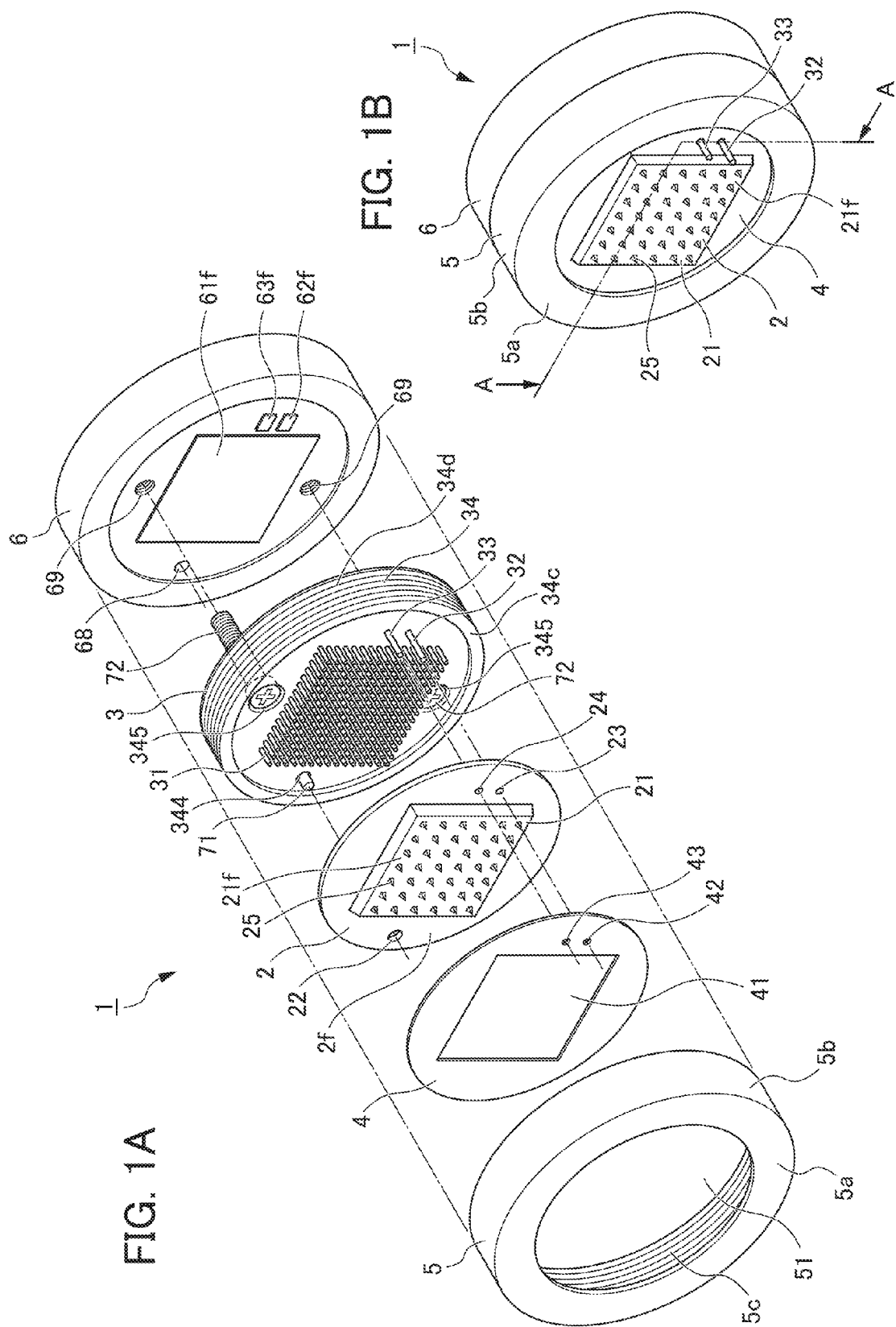
FIGS. 1A and 1B are perspective views illustrating a schematic configuration of a probe device according to an embodiment of the present invention.
Figure 2:
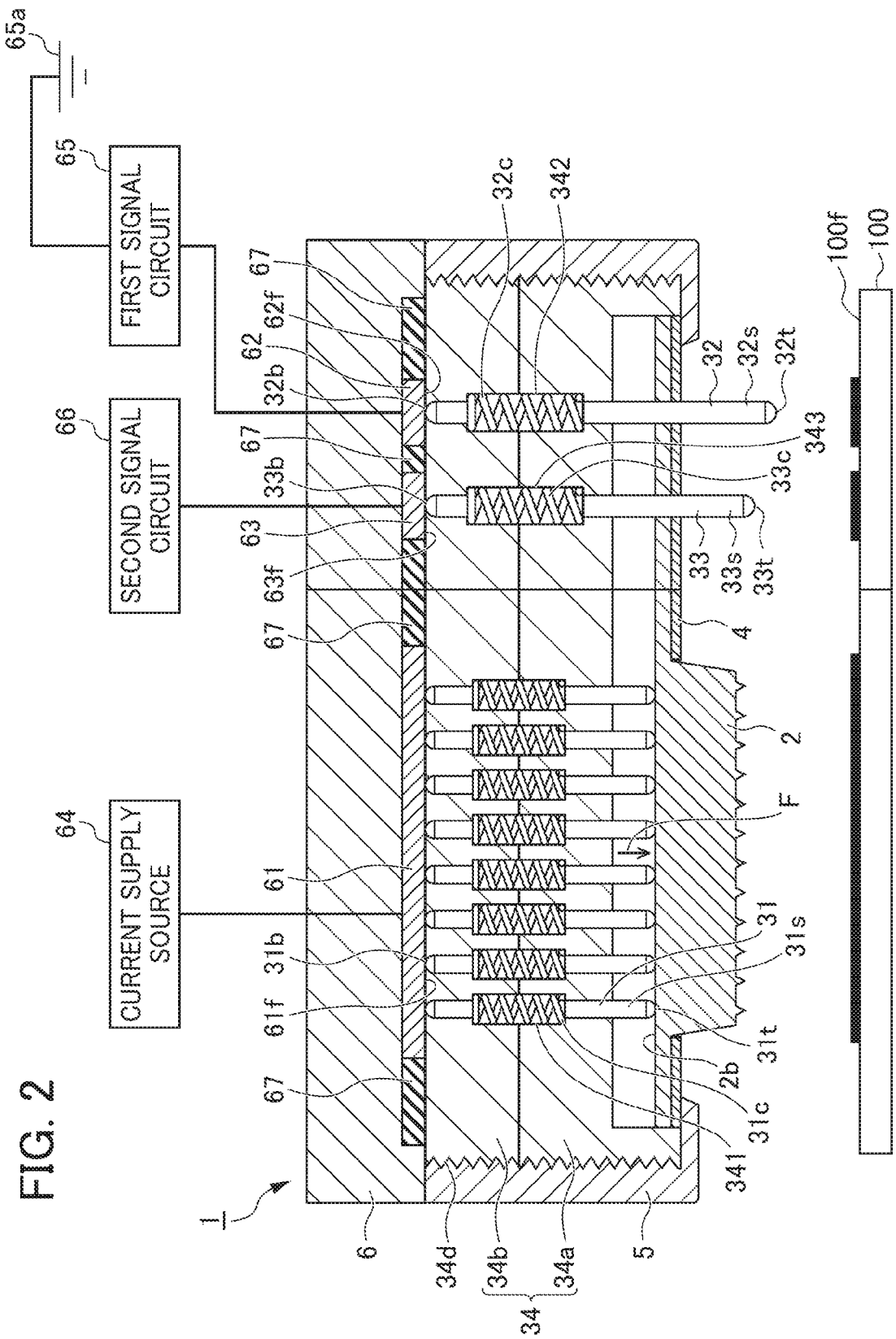
FIG. 2 is a cross-sectional view of the probe device according to the embodiment taken along line A-A of FIG. 1B.

FIGS. 1A and 1B are perspective views illustrating a schematic configuration of a probe device 1 as a current applying device according to an embodiment of the present invention, FIG. 1A is an exploded view, and FIG. 1B is an overall view. FIG. 2 is a cross-sectional view of the probe device 1 according to the embodiment taken along line A-A of FIG. 1B. In the cross section taken along line A-A of FIG. 1B, the cutting direction is changed in mid-course in order to make the configuration of the cross section of the probe device 1 easily understood.

The probe device 1 illustrated in FIGS. 1A and 1B is employed in a semiconductor inspection apparatus for inspecting power semiconductors (IGBT, MOS, diodes, and the like) 100 used for switching a large current of from 400 A to 2000 A. The probe device 1 applies the large current to the power semiconductor H while pressing the power semiconductor H.

The probe device 1 is configured to include a contact body 2, a pressing body assembly 3, an insulating plate 4, a fixing cover 5, and a substrate 6.

As illustrated in FIGS. 1A and 1B, the contact body 2 is disc-shaped and has a quadrangular contact portion 21 which is smaller than the quadrangular power semiconductor 100 at the center and is formed to project toward the power semiconductor 100 side. The contact body 2 is made of nickel. The contact body 2 is inexpensive and easy to manufacture and is suitable for disposable products.

The contact body 2 has one positioning hole 22, which a positioning rod 71 passes through in the thickness direction so as to be inserted into it, in the vicinity of the contact portion 21. In addition, a diameter of the positioning hole 22 of the contact body 2 is larger than an outer diameter of the positioning rod 71 so as to have a predetermined gap, and however, adjustment of the surface 21f of the contact portion 21 of the contact body 2 and the surface 100f of the power semiconductor 100 described later to be parallel is not regulated.

The contact body 2 has two holes consisting of a first signal-pin hole 23 and a second signal-pin hole 24, which a first signal pin 32 and a second signal pin 33 pass through in the thickness direction so as to be inserted into them, at the side of the contact portion 21 opposite to the positioning hole 22.

The contact portion 21 has a surface 21f that is to be in surface-contact with the power semiconductor 100. The surface 21f has a plurality of microscopic projections 25 which are inserted into only the surface electrode layer of the surface layers of the power semiconductor 100. Each of the members of the plurality of microscopic projections 25 has the same configuration. Although the contact portion 21 has the plurality of microscopic projections 25, the surface 21f is a flat surface that is large in comparison to the plurality of microscopic projections 25.

The plurality of microscopic projections 25 is formed by electroforming to have a height which is smaller than the about 10 μm thickness of the surface electrode layer of the power semiconductor 100 and larger than the about 0.1 μm thickness of the oxide layer formed on the surface of the surface electrode layer. Each of the members of the plurality of microscopic projections 25 has the same shape.

Figure 3B:
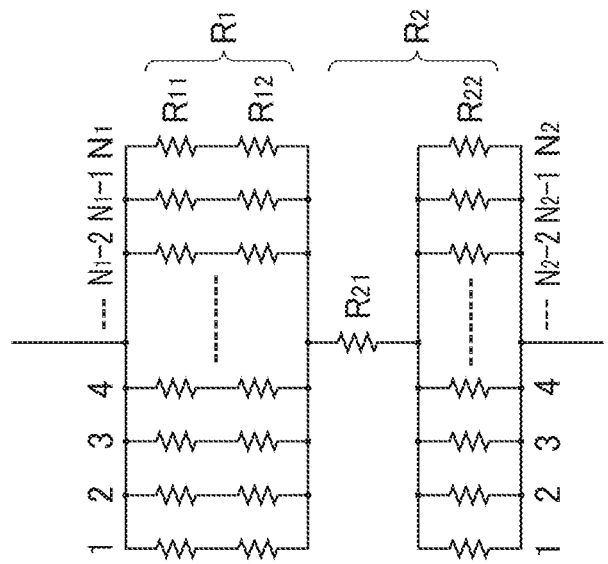
FIGS. 3A and 3B are diagrams illustrating resistance values corresponding to components of the probe device according to the embodiment.
Figure 3A:
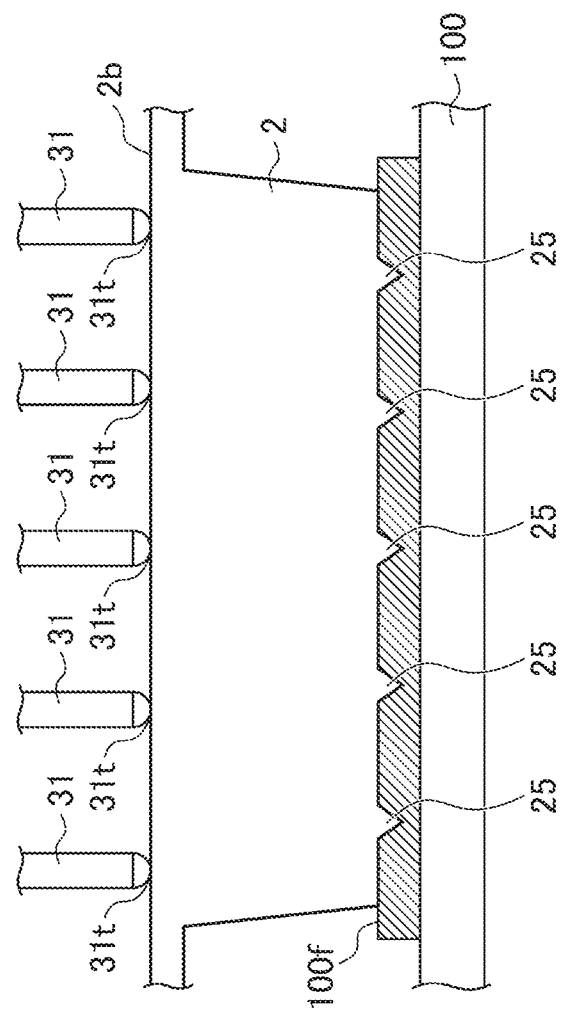

FIGS. 3A and 3B are diagrams illustrating resistance values corresponding to components of the probe device 1 according to the embodiment, FIG. 3A is a diagram illustrating the components, and FIG. 3B is a circuit diagram.

As illustrated in FIGS. 3A and 3B, the contact body 2 has a withstand power $W_{21}$ and a resistance value $R_{21}$ as internal resistance. In addition, the contact body 2 is configured so that the relationship $(I^2 \cdot R_{21} < W_{21})$ where the internal power $I^2 \cdot R_{21}$ of the contact body is smaller than the withstand power $W_{21}$ is satisfied when the current value I is set to the current value flowing through the probe device 1 in the event of failure. Each of the microscopic projections 25 has a withstand power $W_{22}$ and a resistance value $R_{22}$ as a contact resistance with respect to the surface 100f of the power semiconductor 100. Herein, $N_2$ (=100) microscopic projections 25 are installed.

Each of the microscopic projections 25 is configured in the same configuration so that the relationship $((I/N_2)^2 \cdot R_{22} > W_{22})$ where the protrusion power $(I/N_2)^2 \cdot R_{22}$ applied to one microscopic projection 25 is larger than the withstand power $W_{22}$ of one microscopic projection 25 is satisfied when the current value I is set to the current value flowing through the probe device 1 in the event of failure. Namely, each of the microscopic projections 25 is configured so that when the current value $I/N_2$ flows through one microscopic projection 25, the microscopic projection 25 and the surface 100$f$ of the power semiconductor 100 being in contact therewith are destroyed by Joule's heat.

In the embodiment, in order to satisfy the relationship $(I/N_2)^2 \cdot R_{22} > W_{22}$, the withstand power $W_{22}$ of each of the microscopic projections 25 is configured to be decreased. Namely, by decreasing the number of microscopic projections 25 formed on the contact body 2, the current amount flowing through one microscopic projection 25 is increased. In addition, the contact resistance is increased by changing the material or plating material of each microscopic projection 25 into a high-resistance material, or the contact resistance of each microscopic projection 25 is increased by rounding the extremity of each microscopic projection 25 to destabilize the contact.

The contact body 2 as an entire body has a total withstand power $W_2$ including the withstand power $W_{21}$ of the contact body 2 itself and the withstand power $N_2 \times W_{22}$ of the plurality of microscopic projections 25 and a total resistance value $R_2$ including the resistance value $R_{21}$ of the contact body 2 itself and the resistance value $R_{22}/N_2$ as the contact resistance between the plurality of microscopic projections 25 and the surface 100$f$ of the power semiconductor 100. Namely, the resistance value $R_2$ is $R_2 = R_{21} + R_{22}/N_2$. In addition, the contact body 2 as an entire body is configured so to have the relationship $(I^2 \cdot R_2 > W_2)$ where the contact body power $I^2 \cdot R_2$ applied to the contact body 2 is larger than the withstand power $W_2$ of the contact body 2 when the current value I is set to the current value flowing through the probe device 1 in the event of failure. In other words, the relationship $I^2 \cdot R_2 > W_2$ of the contact body 2 as an entire body can be substituted for the relationship $(I/N_2)^2 \cdot R_{22} > W_{22}$ of each microscopic projection 25. Therefore, the relationship $I^2 \cdot R_2 > W_2$ of the contact body 2 as an entire body can be easily designed according to a unit of the component, that is, one microscopic projection 25.

Herein, the contact body power $I^2 \cdot R_2$ is calculated from the total sum of the internal power $I^2 \cdot R_{21}$ of the contact body 2 itself and the power obtained by multiplying the protrusion power $(I/N_2)^2 \cdot R_{22}$ applied to one microscopic projection 25 with the number $N_2$ of microscopic projections 25 based on the resistance value $R_{21}$ of the contact body 2 and the resistance value $R_{22}/N_2$ as the contact resistance between the plurality of microscopic projections 25 and the surface 100$f$ of the power semiconductor 100.

In addition, $R_{21}$ is a resistance value of about 0.1 to 1 mΩ. $R_{22}$ is a resistance value of about 80 mΩ. $W_{22}$ is withstand power of about 20 W. $N_2$ is 100.

As illustrated in FIG. 2, the pressing body assembly 3 includes a plurality of pressing pins 31, a first signal pin 32, a second signal pin 33, and a case 34. The pressing body assembly 3 is expensive and hard to manufacture and ensures durability, and thus, the pressing body assembly 3 needs to be repaired in the case when the pressing body assembly 3 is destroyed by Joule's heat when a large current in the event of failure is applied to the pressing body assembly 3.

Each of the pressing pins 31 has a rod shape and is conductive. The front and posterior extremities 31$t$ and 31$b$ of each pressing pin 31 are formed to have a hemispherical shape so as to reduce frictional resistance. The center region of each pressing pin 31 has a spring portion 31$c$ that elastically rebounds. The outer diameter of the spring portion 31$c$ of the pressing pin 31 is larger than the outer diameters of the rod-shaped extremity portion 31$s$ and the posterior extremity portion of the pressing pin 31 excluding the spring portion 31$c$ of the pressing pin 31. Each member of the plurality of pressing pins 31 has the same configuration.

The pressing pin 31 is in contact with the back surface 2$b$ of the contact body 2 by the extremity 31$t$ projecting from the case 34, and the contact position can be moved. The pressing pins 31 are arranged in the planar direction at equal intervals on the back surface 2$b$ of the contact body 2 and exert a pressing force F on a plurality of sections of the contact body 2.

The pressing pin 31 is in contact with the surface 61$f$ of the pressing-pin electrode 61 of the substrate 6 by the posterior extremity 31$b$ projecting from the case 34, and a second current can flow into the pressing pin 31 from the pressing-pin electrode 61 of the substrate 6.

As illustrated in FIGS. 3A and 3B, each of the pressing pins 31 has a withstand power $W_{11}$, a resistance value $R_{11}$ as internal resistance, and a resistance value $R_{12}$ as contact resistance between the extremity 31$t$ and the back surface 2$b$ of the contact body 2. The $N_1$ (=330) pressing pins 31 are installed. In addition, each of the pressing pins 31 is configured in the same configuration so that the relationship $((I/N_1)^2 \cdot (R_{11} + R_{12}) < W_{11})$ where the pressing-pin power $(I/N_1)^2 \cdot (R_{11} + R_{12})$ is smaller than the withstand power $W_{11}$ is satisfied when the current value I is set to the current value flowing through the probe device 1 in the event of failure. Namely, each of the pressing pins 31 is configured so that even in a case where the current value $I/N_1$ flows through one pressing pin 31, the pressing pin 31 is not destroyed by Joule's heat.

In the embodiment, in order to satisfy the relationship $(I/N_1)^2 \cdot (R_{11} + R_{12}) < W_{11}$, the withstand power $W_{11}$ of each pressing pin 31 is configured to be increased. Namely, by increasing the number of pressing pins 31, the current amount flowing through one pressing pin is decreased. In addition, the contact resistance is decreased by changing the material of the pressing pin 31 or the plating material of the extremity 31$t$ into a low-resistance material, or the contact resistance between the pressing pin 31 and the contact body 2 is decreased by sharpening the hemispherical shape of the extremity 31$t$ of the pressing pin 31 to stabilize the contact.

The pressing body assembly 3 including the plurality of pressing pins 31 has a withstand power $W_1$ including the withstand power $N_1 \times W_{11}$ of the plurality of the pressing pins 31 and a resistance value $R_1$ including the resistance value $R_{11}/N_1$ of the plurality of pressing pins 31 and the resistance value $R_{12}/N_1$ as the contact resistance between the extremities 31$t$ and the plurality of pressing pins 31 and the back surface 2$b$ of the contact body 2. Namely, the resistance value $R_1$ is $R_1 = (R_{11} + R_{12})/N_1$. In addition, the pressing body assembly 3 is configured so to have the relationship $(I^2 \cdot R_1 < W_1)$ where the pressing body power $I^2 \cdot R_1$ applied to the pressing body assembly 3 is smaller than the withstand power $W_1$ of the pressing body assembly 3 when the current value I is set to the current value flowing through the probe device 1 in the event of failure. In other words, the relationship $I^2 \cdot R_1 < W_1$ of the pressing body assembly 3 can be substituted for the relationship $(I/N_1)^2 \cdot (R_{11} + R_{12}) < W_{11}$ of each pressing pin 31. Therefore, the relationship $I^2 \cdot R_1 < W_1$ of the pressing body assembly 3 can be easily designed according to one unit of the component, that is, one pressing pin 31.

Herein, the pressing body power $I^2 \cdot R_1$ is calculated from the power obtained by multiplying the pressing-pin power $(I/N_1)^2 \cdot (R_{11} + R_{12})$ by the number $N_1$ of pressing pins based on the resistance value $R_{11}/N_1$ of the plurality of pressing pins 31 and the resistance value $R_{12}/N_1$ as the contact resistance between the extremities 31$t$ of the plurality of pressing pins 31 and the back surface 2$b$ of the contact body 2.

In addition, $R_{11}+R_{12}$ is a resistance value of about 40 mΩ. $W_{11}$ is a withstand power of about 4 W. $N_1$ is 330.

As illustrated in FIG. 2, the first signal pin 32 has a rod shape and is conductive. Front and posterior extremities 32*t* and 32*b* of the first signal pin 32 are formed to have a hemispherical shape so as to reduce frictional resistance. The center region of the first signal pin 32 has a spring portion 32*c* that elastically rebounds. The outer diameter of the spring portion 32*c* of the first signal pin 32 is larger than the outer diameters of the rod-shaped extremity portion 32*s* and the posterior extremity portion of the first signal pin 32 excluding the spring portion 32*c* of the first signal pin 32. The first signal pin 32 is configured so that the rod-shaped extremity portion 32*s* at the extremity side of the spring portion 32*c* is longer than each of the rod-shaped extremity portions 31*s* of the pressing pins 31.

The first signal pin 32 inputs a first current into the emitter of the power semiconductor 100 into the power semiconductor 100.

The first signal pin 32 is in contact with the surface 100*f* of the power semiconductor 100 via the extremity 32*t* projecting from the case 34, and the contact position can be moved. The first signal pin 32 is in contact with the surface 62*f* of the first signal-pin electrode 62 of the substrate 6 via the posterior extremity 32*b* projecting from the case 34 and can transfer an electrical signal from the first signal-pin electrode 62 of the substrate 6.

The second signal pin 33 has the same configuration as that of the first signal pin 32. The second signal pin 33 is configured so that the rod-shaped extremity portion 33*s* at the extremity side of the spring portion 33*c* is longer than each of the rod-shaped extremity portions 31*s* of the pressing pins 31 and is shorter than the rod-shaped extremity portion 32*s* of the first signal pin 32.

The second signal pin 33 inputs a control signal into the gate of the power semiconductor 100 for controlling "on" and "off" of the power semiconductor 100 into the power semiconductor 100.

The second signal pin 33 is in contact with the surface 100*f* of the power semiconductor 100 via the extremity 33*t* projecting from the case 34, and the contact position can be moved. The second signal pin 33 is in contact with the surface 63*f* of a second signal-pin electrode 63 of the substrate 6 via the posterior extremity 33*b* projecting from the case 34 and can transfer an electrical signal from the second signal-pin electrode 63 of the substrate 6.

As illustrated in FIG. 2, in the probe device 1, the extremity 32*t* of the first signal pin 32 projects most, the extremity 33*t* of the second signal pin 33 projects next to the extremity 32*t* of first signal pin 32, and the surface 21*f* of the contact portion 21 of the contact body 2 projects next to the extremity 33*t* of the second signal pin 33.

As illustrated in FIG. 2, the case 34 is configured to include a pair of circular plate members, that is, two case members 34*a* and 34*b*, and has a plurality of pressing-pin holes 341, a first signal-pin hole 342, and a second signal-pin hole 343.

The plurality of pressing pins 31, the first signal pin 32, and the second signal pin 33 constitute the pressing body assembly 3 by arranging the spring portions 31*c*, 32*c*, and 33*c* of the pins 31, 32, and 33 on the case member 34*a* which is one of the two divided members of the case 34 so as to be accommodated into cavity portions for spring portions of the holes 341, 342, and 343 in the case member 34*a* and by aligning and integrating the two case members 34*a* and 34*b*.

As illustrated in FIGS. 1A and 1B, the case 34 has one positioning hole 344, which the positioning rod 71 passes through in the thickness direction so as to be inserted into it, and two fastening holes 345, which fastening bolts 72 pass through in the thickness direction so as to be inserted into it, in the vicinity of the plurality of pressing-pin holes 341. The fastening holes 345 have accommodating portions for accommodating heads of the fastening bolts 72, and the two fastening holes 345 are arranged on a straight line penetrating through the center of the case 34 to be separated by the plurality of pressing-pin holes 341.

The case 34 has an annular convex portion 34*c* projecting toward the power semiconductor 100 side on the surface at the extremity side so as to guide the outer periphery of the contact body 2. The annular convex portion 34*c* can accommodate the contact body 2 on the internal side, so that the inner peripheral surface thereof smoothly regulates the movement of the contact body 2.

The case 34 has a threaded portion 34*d* on the outer peripheral surface thereof.

As illustrated in FIG. 2, the plurality of pressing-pin holes 341 are arranged in the planar direction at equal intervals in the same range as that of the contact portion 21 of the contact body 2. The pressing pins 31 are arranged in the plurality of pressing-pin holes 341 to pass through in the thickness direction of the case 34. Namely, the center regions of the pressing-pin holes 341 are formed as cavity portions of which inner diameter is larger than other portions so as to be fitted to the size of the spring portions 31*c* of the pressing pins 31, and the pressing pins 31 are arranged in the pressing-pin holes 341 by accommodating the spring portions 31*c* of the pressing pins 31 in the cavity portions. The pressing pins 31 accommodated in the pressing-pin holes 341 allow the extremities 31*t* and the posterior extremities 31*b* to project at the outer side of the case 34 by the rod-shaped extremity portions 31*s* and the posterior extremity portions inserted into the pressing-pin holes 341. Preferably, the inner surface of each pressing-pin hole 341 is formed to have a smooth surface so that the pressing pin 31 can smoothly move inside the pressing-pin holes 341.

A first signal-pin hole 342 is formed at one position in the adjacent area of the plurality of pressing-pin holes 341. A first signal pin 32 is arranged in the first signal-pin hole 342 to pass through in the thickness direction of the case 34. Namely, the center region of the first signal-pin hole 342 is formed as a cavity portion of which inner diameter is larger than other portions so as to be fitted to the size of the spring portion 32*c* of the first signal pin 32, and the first signal pin 32 is arranged in the first signal-pin hole 342 by accommodating the spring portion 32*c* of the first signal pin 32 in the cavity portion. The first signal pin 32 accommodated in the first signal-pin hole 342 allows the extremity 32*t* and the posterior extremity 32*b* to project at the outer side of the case 34 by the rod-shaped extremity portion 32*s* and the posterior extremity portion inserted into the first signal-pin hole 342. Preferably, the inner surface of each of the first signal-pin holes 342 is formed to have a smooth surface so that the first signal pin 32 can smoothly move inside the first signal-pin hole 342.

A second signal-pin hole 343 is formed together with the first signal-pin hole 342 at one position in the adjacent area of the plurality of pressing-pin holes 341. The second signal-pin hole 343 has the same configuration as that of the first signal-pin hole 342.

As illustrated in FIGS. 1A and 1B, the insulating plate 4 is disc-shaped and is configured by an insulating member, and when the probe device 1 is assembled, the insulating plate 4 is located at the extremity of the probe device 1.

The insulating plate 4 has an opening 41 at the center region thereof. The insulating plate 4 covers the surface 2*f* of the peripheral edge of the contact portion 21 of the contact body 2 and allows the contact portion 21 of the contact body 2 to penetrate through the opening 41 and to project toward the power semiconductor 100 side.

The insulating plate 4 has a first signal-pin hole 42 and a second signal-pin hole 43, which the first signal pin 32 and the second signal pin 33 are inserted into, in the vicinity of the opening 41.

As illustrated in FIGS. 1A and 1B, the fixing cover 5 is an annular member and has a ring portion 5a and cylindrical portion 5b. The ring portion 5a has an opening 51, the diameter of which is smaller than the outer diameter of the insulating plate 4 and larger than that of the opening 41 of the insulating plate 4, inside the ring portion 5a. The cylindrical portion 5b extends in the direction from the ring portion 5a to the substrate 6 and has a threaded portion 5c on the inner peripheral surface thereof. The threaded portion 5c formed on the inner peripheral surface of the cylindrical portion 5b of the fixing cover 5 is engaged with the threaded portion 34d formed on the outer peripheral surface of the case 34 of the pressing body assembly 3.

As illustrated in FIG. 2, the substrate 6 is disc-shaped having the same diameter as that of the fixing cover 5. The substrate 6 includes a pressing-pin electrode 61, a first signal-pin electrode 62, and a second signal-pin electrode 63.

The pressing-pin electrode 61 is formed in the range where the posterior extremities 31b of the plurality of pressing pins 31 projects and is connected to a current supply source 64 for the second current. The surface 61f of the pressing-pin electrode 61 is formed to have a smooth surface, and when the probe device 1 is assembled, the surface 61f is in contact with the posterior extremities 31b of the plurality of pressing pins 31.

The first signal-pin electrode 62 is formed at the position where the posterior extremity 32b of the first signal pin 32 projects to supply the first current and is connected to a grounded first signal circuit 65. The surface 62f of the first signal-pin electrode 62 is formed to have a smooth surface, and when the probe device 1 is assembled, the surface 62f is in contact with the posterior extremity 32b of the first signal pin 32.

The second signal-pin electrode 63 is formed at the position where the posterior extremity 33b of the second signal pin 33 projects to be connected to a second signal circuit 66 for supplying a control signal. The surface 63f of the second signal-pin electrode 63 is formed to have a smooth surface, and when the probe device 1 is assembled, the surface 63f is in contact with the posterior extremity 33b of the second signal pin 33.

The pressing-pin electrode 61, the first signal-pin electrode 62, and the second signal-pin electrode 63 are separated by an insulating member 67 inside the substrate 6 so as not to be electrically conducting with each other.

As illustrated in FIGS. 1A and 1B, the substrate 6 has one positioning hole 68, which the positioning rod 71 is inserted into, and two fastening holes 69, which the fastening bolts 72 are fastened to. The fastening holes 69 are configured as threaded holes that are engaged with the threaded portions of the fastening bolts 72.

The probe device 1 can be assembled by installing the fixing cover 5 by using the one positioning rod 71 and the two fastening bolts 72.

More specifically, the pressing body assembly 3 is located on the substrate 6, and the positioning rod 71 is inserted into the positioning hole 344 of the pressing body assembly 3 and also into the positioning hole 68 of the substrate 6. In addition, the fastening bolts 72 are inserted into the fastening holes 345 of the pressing body assembly 3 and also into the fastening holes 69 of the substrate 6. Therefore, the positional relationship between the substrate 6 and the pressing body assembly 3 is defined.

Next, the pressing body assembly 3 is fixed to the substrate 6 by engaging the fastening bolts 72 with the fastening holes 69 of the substrate 6. In this state, the extremity of the positioning rod 71 projects from the surface of the pressing body assembly 3. The projecting extremity of the positioning rod 71 is inserted into the positioning hole 22 of the contact body 2, and the contact body 2 is disposed inside the annular convex portion 34c of the case 34, so that the contact body 2 is smoothly positioned. At this time, the back surface 2b of the contact body 2 is in contact with the projecting extremities 31t of the pressing pins 31 of the pressing body assembly 3. Even in the state where the contact body 2 is positioned, the contact body 2 can be moved.

Next, the contact body 2 is covered with the insulating plate 4, and in this state, the fixing cover 5 is fixed to the pressing body assembly 3 by engaging the threaded portion 5c formed on the inner peripheral surface of the cylindrical portion 5b of the fixing cover 5 with the threaded portion 34d formed on the outer peripheral surface of the pressing body assembly 3. At this time, the surface 2f of the contact body 2 is pressed on the ring portion 5a of the fixing cover 5 in the direction toward the substrate 6, and the back surface 2b of the contact body 2 is pressed from the extremities 31t of the pressing pins 31 in the reverse direction of the pressing direction of the fixing cover 5.

In addition, in the semiconductor inspection, the contact body 2 is destroyed when an abnormality of the power semiconductor 100 is detected. Therefore, the replacement frequency of the contact body 2 is different to those of other parts. In the probe device 1, the contact body 2 can be replaced by loosening the threaded portion 5c of the inner peripheral surface of the cylindrical portion 5b of the fixing cover 5 from the threaded portion 34d formed on the outer peripheral surface of the pressing body assembly 3 and only by removing the fixing cover 5 in the reverse of the assembly of the probe device 1 described above.

Next, the power semiconductor 100 will be described.

The power semiconductor 100 is an IGBT, a MOS, a diode, or the like used for switching a large current of 400 A to 2000 A. The power semiconductor 100 is arranged on a mounting table (not illustrated). The mounting table is connected to a cylinder (not illustrated), and the cylinder presses the power semiconductor 100 of the mounting table on the probe device 1.

Next, inspection of the power semiconductor 100 using the probe device 1 will be described.

Initially, the probe device 1 is in a standby state where the probe device 1 is separated from the power semiconductor 100.

When the inspection is started, first, the mounting table on which the power semiconductor 100 is mounted is moved forward in the direction toward the probe device 1 by the cylinder.

Due to the forward movement of the mounting table, the extremity 32t of the first signal pin 32 is in contact with the power semiconductor 100.

Next, due to the forward movement of the mounting table, the extremity 33t of the second signal pin 33 is in contact with the power semiconductor 100.

In addition, due to the forward movement of the mounting table, the surface 21f of the contact portion 21 of the contact body 2 is in contact with the power semiconductor 100.

More specifically, first, the plurality of microscopic projections 25 is inserted into only the surface electrode layer of the surface layers of the power semiconductor 100. Therefore, the plurality of microscopic projections 25 serves as spikes so that the position of the contact body 2 with respect to the power semiconductor 100 is defined.

When the mounting table is further pressed on the probe device 1 by the cylinder, the contact body 2 is separated from the fixing cover, which leads to a floating state. Then, the contact body 2 is inclined so as to follow the inclination of the surface 100f of the power semiconductor 100, and strongly-pressing pressing pins 31 are contracted and weakly-pressing pressing pins 31 exert the pressing force F. Therefore, each pressing pin 31 balances between the pressing force F and the contraction. Accordingly, the plurality of pressing pins 31 allows the contact pressure to be uniform by adjusting the surface 21f of the contact portion 21 of the contact body 2 and the surface 100f of the power semiconductor 100 to be parallel. Therefore, the surface 21f of the contact portion 21 of the contact body 2 is uniformly in contact with the surface 100f of the power semiconductor 100 to press the surface 100f.

Particularly, the contact body 2 is a member of which the entire back surface 2b is pressed on the plurality of pressing pins 31 and is finely rocked according to behavior of the plurality of pressing pins 31, so that the contact body and the surface 100f of the power semiconductor 100 are adjusted to be parallel to each other.

At this time, when the mounting table is pressed on the probe device 1 by the cylinder, horizontal displacement, torsion, vibration, or the like may occur in the mounting table. On the other hand, the plurality of pressing pins 31 have a low frictional resistance because each of the extremities 31t has a hemispherical shape, and the plurality of pressing pins 31 can absorb horizontal displacement, torsion, vibration, or the like occurring in the mounting table as displacement of the contact positions of the extremities 31t which are in contact with the back surface 2b of the contact body 2. Therefore, since the contact state of the contact body 2 with respect to the surface 100f of the power semiconductor 100 is not influenced by the horizontal displacement, torsion, vibration, or the like, the plurality of microscopic projections 25 does not cut the surface 100f of the power semiconductor 100 due to the position displacement of the contact body 2.

The surface 21f of the contact portion 21 of the contact body 2 is a flat surface that is larger as compared to the plurality of microscopic projections 25 and becomes a regulated surface that regulates introduction of the plurality of microscopic projections 25 into the surface electrode layer. Therefore, even in the case when pressure is further exerted after the plurality of microscopic projections 25 is inserted into the surface electrode layer of the power semiconductor 100, the surface 21f maintains the contact state with respect to the power semiconductor 100, and regulates the excessive introduction of the plurality of microscopic projections 25 into the surface electrode layer.

Next, the inspection of the power semiconductor 100 is performed by allowing the current supply source 64 at the back of the substrate 6 to supply the second current as a large current to the contact body 2 through the plurality of pressing pins 31, allowing the first signal circuit 65 at the back of the substrate 6 to supply the first current to the first signal pin 32, and allowing the second signal circuit 66 at the back of the substrate 6 to input the control signal for controlling "on" and "off" of the power semiconductor 100 to the second signal pin 33.

After the inspection is performed, the mounting table is moved backward in the direction opposite to the probe device 1 by the cylinder.

Due to the backward movement of the mounting table, the surface 21f of the contact portion 21 of the contact body 2 is separated from the power semiconductor 100.

Next, due to the backward movement of the mounting table, the extremity 33t of the second signal pin 33 is separated from the power semiconductor 100.

In addition, due to the backward movement of the mounting table, the extremity 32t of the first signal pin 32 is separated from the power semiconductor 100.

Therefore, the probe device 1 returns to standby state.

Next, cases when a large current in the event of failure is applied to the probe device 1 and the power semiconductor 100 will be described.

(Case 1)

FIGS. 4A and 4B are diagrams illustrating a case (Case 1) when a large current in the case of failure is applied to the probe device 1 according to the embodiment, FIG. 4A is a state diagram, and FIG. 4B is a circuit diagram.

Case 1 is a case when there is a defect at one site (a portion) of the power semiconductor 100 indicated by a star. In this case, a current having a current value I (=30 A) is locally concentrated on one site (one microscopic projection) of the contact body 2 which is located immediately above and in contact with the power semiconductor 100.

In the case when there are $N_1$ (=330) pressing pins 31, the current value per pressing pin is $I/N_1=30/330 \approx 0.1$ A. The resistance value per pressing pin is $R_{11}+R_{12}=40$ mΩ=0.04Ω. The pressing-pin power per pressing pin is $(I/N_1)^2 \cdot (R_{11}+R_{12}) \approx 0.1 \times 0.1 \times 0.04 = 0.0004$ W. On the other hand, the withstand power per pressing pin is set to 4 W.

In addition, the current value of $N_2$ (=1) microscopic projection 25 as an electric path is $I/N_2=30/1=30$ A. $R_{22}$ of one microscopic projection is 80 mΩ=0.08Ω. The protrusion power of one microscopic projection is $(I/N_2)^2 \cdot R_{22}=30 \times 30 \times 0.08=72$ W. On the other hand, the withstand power of one microscopic projection is set to 20 W.

As a result, pressing-pin power (=0.0004 W)<withstand power (=4 W) of the pressing pin, so that the relationship $(I/N_1)^2 \cdot (R_{11}+R_{12})<W_{11}$ is satisfied. In addition, protrusion power (=72 W)>withstand power (=20 W) of the microscopic projection, so that the relationship $(I/N_2)^2 \cdot R_{22}>W_{22}$ is satisfied. Therefore, the one microscopic projection 25 as an electric path and the surface 100f of the power semiconductor 100 are destroyed first of all. Accordingly, the destroyed contact body 2 blocks the large current in the event of failure to protect the pressing body assembly 3 from the large current. Therefore, it is possible to use the pressing body assembly 3 for its own lifespan without it having to be repaired.

(Case 2)

Figure 5B:
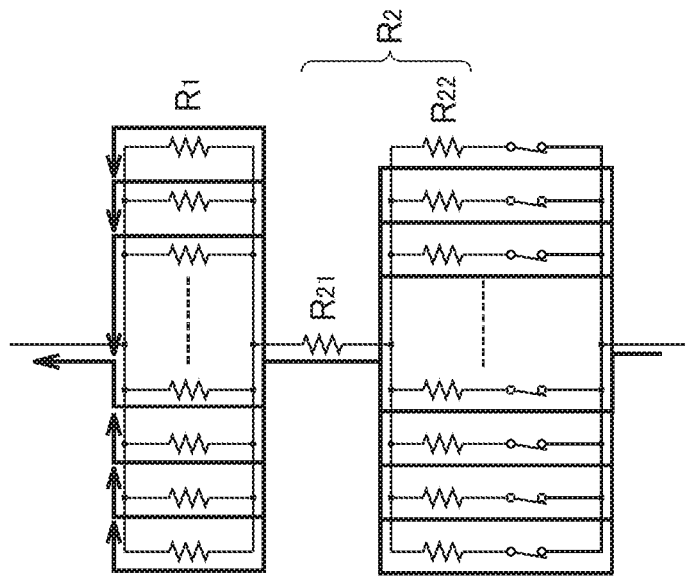
FIGS. 5A and 5B are diagrams illustrating the case (Case 2) when a large current in the event of failure is applied to the probe device according to the embodiment.
Figure 5A:
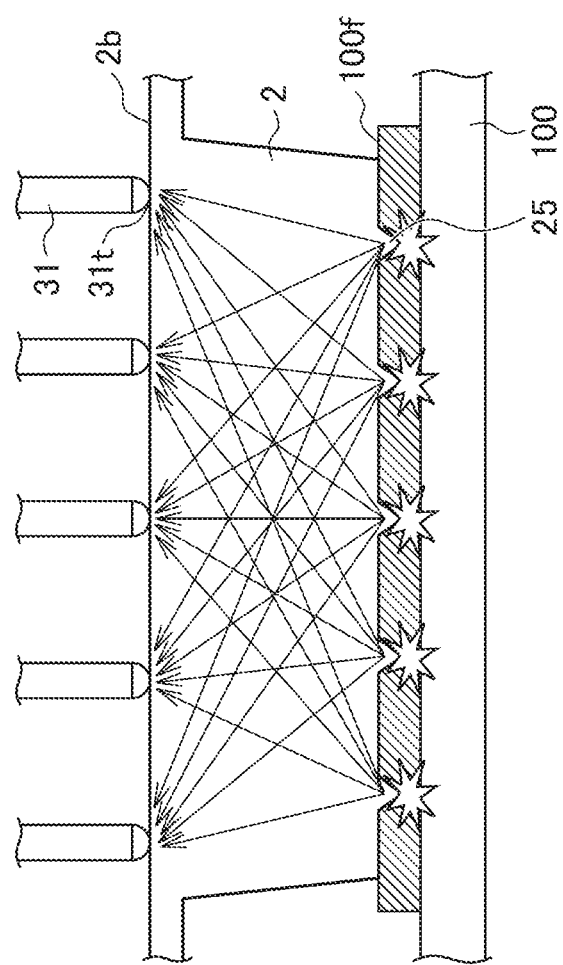

FIGS. 5A and 5B are diagrams illustrating a case (Case 2) when a large current in the event of failure is applied to the probe device 1 according to the embodiment, FIG. 5A is a state diagram, and FIG. 5B is a circuit diagram.

Case 2 is a case when there are defects at all sites (most portions) of the power semiconductor 100. In this case, the current having a current value I (=2000 A) is divided over all the sites (the entire microscopic projections indicated by stars) of the contact body 2 which are located immediately above and in contact with the power semiconductor 100.

In the case when there are $N_1$ (=330) pressing pins 31, the current value per pressing pin is $I/N_1=2000/330 \approx 6$ A. The resistance value per pressing pin is $R_{11}+R_{22}=40$ mΩ=0.04Ω. The pressing-pin power per pressing pin is $(I/N_1)^2 \cdot (R_{11}+R_{12}) \approx 6 \times 6 \times 0.04=1.6$ W. On the other hand, the withstand power per pressing pin is set to 4 W.

In addition, in all the $N_2$ (=100) microscopic projections 25 as electric paths, the current value of one microscopic projection is $I/N_2=2000/100=20$ A. $R_{22}$ of one microscopic projection is 80 m$\Omega$=0.08$\Omega$. The protrusion power of one microscopic projection is $(I/N_2)^2 \cdot R_{22}=20 \times 20 \times 0.08=32$ W. On the other hand, the withstand power of one microscopic projection is set to 20 W.

As a result, pressing-pin power (=1.6 W)<withstand power (=4 W) of the pressing pin, so that the relationship $(I/N_1)^2 \cdot (R_{11}+R_{12})<W_{11}$ is satisfied. In addition, protrusion power (=32 W)>withstand power (=20 W) of the microscopic projection, so that the relationship $(I/N_2)^2 \cdot R_{22}>W_{22}$ is satisfied. Therefore, the 100 microscopic projections 25 as electric paths and the surface 100f of the power semiconductor 100 are destroyed first of all. Accordingly, the destroyed contact body 2 blocks the large current in the event of failure to protect the pressing body assembly 3 from the large current. Therefore, it is possible to use the pressing body assembly 3 for its own lifespan without it having to be repaired.

In the probe device 1 according to the embodiment heretofore, it is possible to obtain the following effects.

(1) When a large current (current value I) in the event of failure is applied to the probe device 1 which is configured by serially connecting the contact body 2 and the pressing body assembly 3 and applies a current to the power semiconductor 100, the pressing body power $I^2 \cdot R_1$ of the pressing body assembly 3 is smaller than the withstand power $W_1$ of the pressing body assembly 3, and the contact body power $I^2 \cdot R_2$ applied to the surface 21f of the contact body 2 which is in contact with the power semiconductor 100 is larger than the withstand power $W_2$ of the surface 21f.

Herein, the contact body 2 is inexpensive and easy to manufacture and is suitable as a disposable product. On the other hand, the pressing body assembly 3 is expensive and difficult to manufacture and ensures durability, and thus, the pressing body assembly 3 needs to be repaired in the case when the pressing body assembly 3 is destroyed by Joule's heat when a large current in the event of failure is applied to the pressing body assembly 3.

In the embodiment, when a larger current in the event of failure is applied to the probe device 1, the contact body 2 is destroyed earlier than the pressing body assembly 3. Accordingly, the destroyed contact body 2 blocks the large current in the event of failure to protect the pressing body assembly 3 from the large current. Therefore, it is possible to use the pressing body assembly 3 for its own lifespan without it having to be repaired.

(2) The pressing body power $I^2 \cdot R_1$ of the pressing body assembly 3 is calculated based on the resistance $R_{11}$ of the plurality of pressing pins 31 constituting the pressing body assembly 3 and the contact resistance $R_{22}$ between the extremities 31t of the plurality of pressing pins 31 constituting the pressing body assembly 3 and the back surface 2b of the contact body 2, and the contact body power $I^2 \cdot R_2$ is calculated based on the resistance $R_{21}$ of the contact body 2 itself and the contact resistance $R_{22}$ between the plurality of microscopic projections 25 of the contact body 2 and the surface 100f of the power semiconductor 100. Therefore, it is possible to calculate the pressing body power $I^2 \cdot R_1$ which is smaller than the withstand power $W_1$ of the pressing body assembly 3 and the contact body power $I^2 \cdot R_2$ which is larger than the withstand power $W_2$ of the surface 21f of the contact body 2. Accordingly, when the larger current (current value I) in the event of failure is applied to the probe device 1, it is possible to configure the relationship where the pressing body power $I^2 \cdot R_1$ of the pressing body assembly 3 is smaller than the withstand power $W_1$ of the pressing body assembly 3 and the contact body power $I^2 \cdot R_2$ applied to the surface 21f of the contact body 2 at the side which is in contact with the power semiconductor 100 is larger than the withstand power $W_2$ of the surface 21f.

(3) The relationship where the pressing body power $I^2 \cdot R_1$ of the pressing body assembly 3 is smaller than the withstand power $W_1$ of the pressing body assembly 3 is the relationship where the pressing-pin power $(I/N_1)^2 \cdot (R_{11}+R_{12})$ of the pressing pins 31 is smaller than the withstand power $W_{11}$ of the pressing pins 31. Accordingly, the relationship between the pressing body power $I^2 \cdot R_1$ and withstand power $W_1$ of the pressing body assembly 3 is substituted by the relationship between the pressing-pin power $(I/N_1)^2 \cdot (R_{11}+R_{12})$ and withstand power $W_{11}$ of the one pressing pin 31, so that the relationship can be easily designed according to one unit of the component, that is, one pressing pin 31.

It should be noted that the present invention is not limited to the above-described embodiments, and modifications, improvements, and the like which are carried out within a scope in which objects of the present invention can be achieved are also included in the scope of the present invention.

What is claimed is:

1. A current applying device which is configured by serially connecting a contact electrode which is to be in contact with a surface of a semiconductor to apply a current and a pressing body which presses the contact electrode and applies the current to the semiconductor,
   wherein the current applying device is configured so that when a pressing body power applied to the pressing body is smaller than a withstand power of the pressing body, a contact electrode power applied to the contact electrode is larger than a withstand power of the contact electrode,
   wherein the pressing body power is calculated based on a resistance of the pressing body itself and a contact resistance between the pressing body and the contact electrode, and
   wherein the contact electrode power is calculated based on a resistance of the contact electrode itself and a contact resistance between the contact electrode and the semiconductor.

2. The current applying device according to claim 1,
   wherein the pressing body includes a plurality of elastic bodies, and
   wherein a relationship where the pressing body power applied to the pressing body is smaller than the withstand power of the pressing body is equal to a relationship where an elastic body power applied to one elastic body of all the elastic bodies is smaller than a withstand power of one elastic body.

* * * * *